SOLID STATE DEVICES UTILIZING A METAL BETWEEN TWO SEMICONDUCTOR MATERIALS

Filed May 2, 1960 2 Sheets-Sheet 1

INVENTOR.
ALBERT ROSE
BY
W. S. Hill
Agent

INVENTOR.
ALBERT ROSE
BY
W. B. Hiel
Agent 3,250,966
Patented May 10, 1966

3,250,966

SOLID STATE DEVICES UTILIZING A METAL BETWEEN TWO SEMICONDUCTOR MATERIALS

Albert Rose, Princeton, N.J., assignor to Radio Corporation of America, a corporation of Delaware Filed May 2, 1960, Ser. No. 26,175
28 Claims. (Cl. 317—235)

Figure 1:
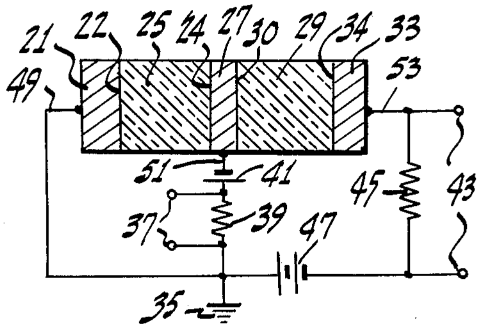

This invention relates to solid state devices, particularly to triodes, which may be used for amplifying, switching, and similar functions in electronic circuits.

A trode is an electronic device having three terminals, in which electric current is made to flow between two of the terminals, which are referred to as cathode and anode or as emitter and collector. The instantaneous amount of current flowing between the emitter and collector terminals is controlled by a signal applied to the third terminal, which is referred to as the grid, base, or control electrode.

An object of this invention is to provide novel and improved solid state devices.

A further object is to provide improved solid state triodes which may be used for amplifying, switching, and similar functions in electronic circuits.

Another object is to provide improved solid state devices which are simple in construction, cheap and easy to build, and simple to operate.

In general, the devices herein comprise two semiconductor bodies, designated the emitter and collector regions respectively making abrupt blocking contact to opposite sides of a common thin conducting layer, designated the grid, which grid is substantially transparent or premeable to energetic free charge carriers in the region between the blocking contacts. The devices are completed by an ohmic contact to each of said semiconductor bodies respectively.

In operation, the blocking contact to the emitter region, designated the emitter blocking contact, is forward biased so that free charge carriers are emitted into the grid. The density of carriers emitted into the grid is controlled by the bias voltage applied across the emitter blocking contact, which bias voltage has the effect of changing the height of the potential barrier on the emitter side of the emitter blocking contact. The blocking contact of the collector region, designated the collector blocking contact, is reverse biased so that the carrier current therethrough is proportional to the density of free charge carriers at the collector blocking contact. Thus, a relatively small amount of energy in the form of the small bias voltage applied across the emitter blocking contact can control the flow of a relatively large amount of energy in the form of emitted free charge carriers flowing through the grid and through the collector blocking contact whose back bias is large compared with the forward bias on the emitter.

In the preferred form of the device, the height of the potential barrier at the emitter blocking contact is higher than the height of the potential barrier at the collector blocking contact. This is achieved either by selecting a single composition for the grid and different compositions for the emitter and collector regions; or by selecting the same composition for both emitter and collector regions and different compositions in the grid at each of the emitter and collector blocking contacts respectively.

Figure 2:
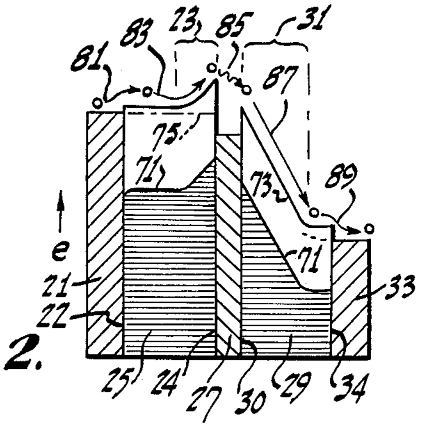
Figure 9:
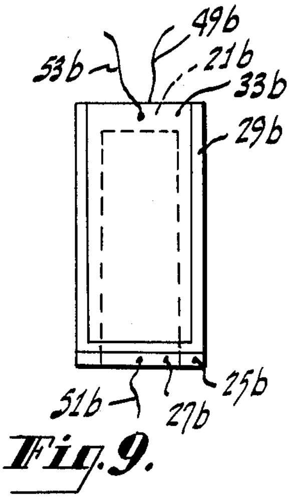
Figure 10:
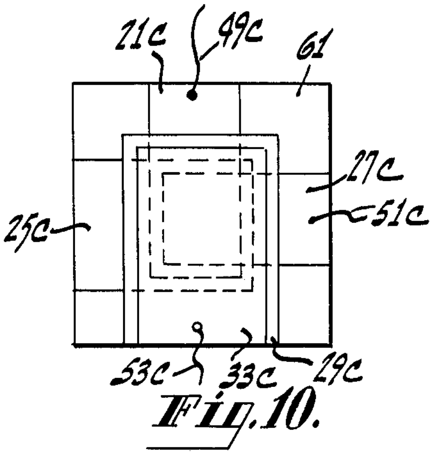
Figure 13:
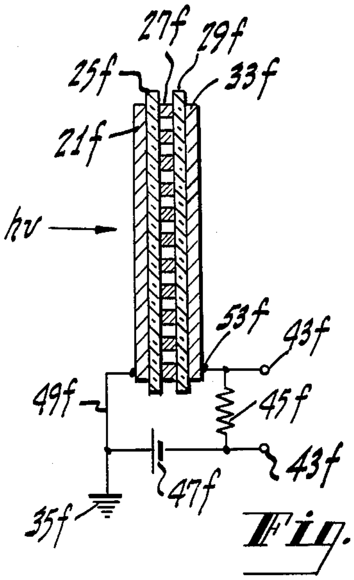
Figure 11:
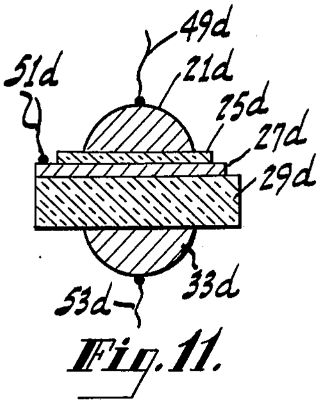
Figure 12:
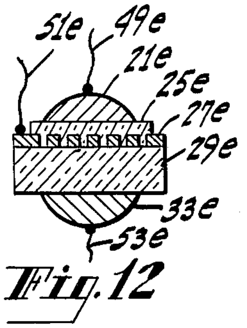
Figure 3:
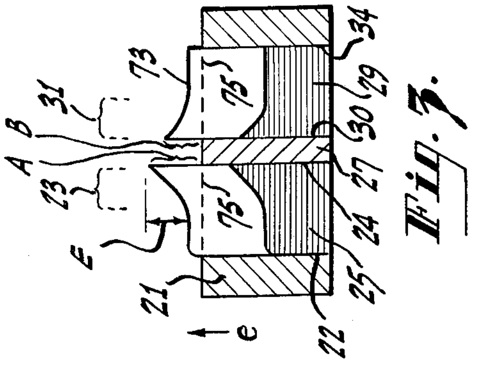
Figure 4:
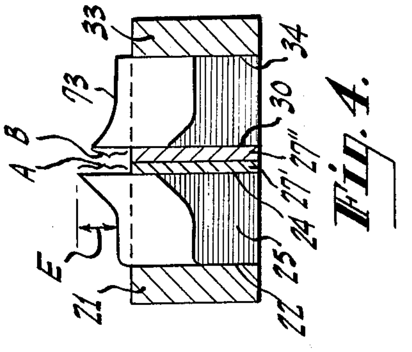
Figure 5:
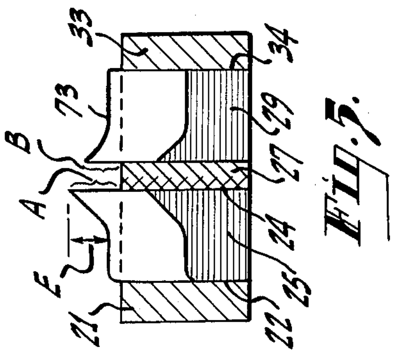
Figure 6:
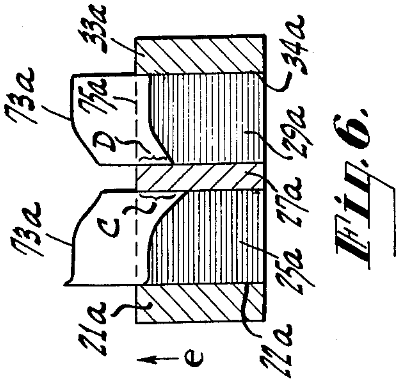
Figure 7:
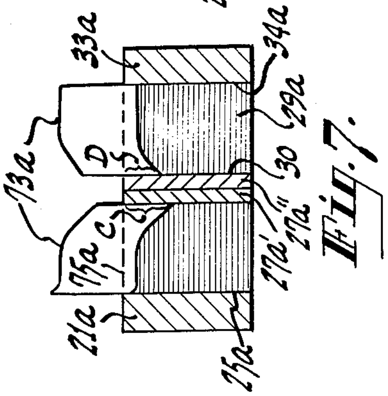
Figure 8:
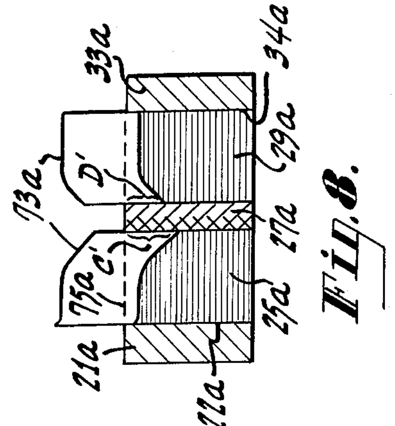

A more detailed description of the invention appears below and various embodiments are illustrated in the drawings in which:

FIGURE 1 is a partially schematic, partially sectional view of a typical embodiment of the invention in a simple amplifier circuit, FIGURE 2 is an energy diagram illustrating the valence and conduction bands of the typical embodiment as biased in the circuit of FIGURE 1, FIGURE 3 is an energy diagram illustrating the valence and conduction bands of the typical embodiment of FIGURE 1 with no bias applied, FIGURES 3, 4, and 5 are each energy diagrams illustrating alternative embodiments using semiconductor bodies having N-type conductivity, FIGURES 6, 7, and 8 are each energy diagrams illustrating alternative embodiments using semiconductor bodies having P-type conductivity, FIGURE 9 is a plan view of another embodiment of the invention comprising a semiconductor crystal having multiple layers thereon, FIGURE 10 is a plan view of another embodiment of the invention consisting entirely of multiple layers produced on a passive support, FIGURES 11 and 12 are sectional elevational views of other embodiments of the invention wherein the ohmic contacts are produced by melting and cooling and, FIGURE 13 is a sectional elevational view of another embodiment of the invention adapted for an input of radiant energy.

Similar reference numerals are used for similar structures throughout the drawings.

In FIGURE 1, a typical embodiment of the invention is shown in a sectional view. The device comprises an emitter region 25 in blocking contact with one side of a grid 27 and a collector region 29 in blocking contact with the other side of the grid 27. An emitter ohmic contact 21 contacts the emitter region 25 and a collector ohmic contact 33 contacts the collector region 29.

The emitter and collector regions 25 and 29 are either P-type or N-type conductivity semiconductors, but both regions are of the same conductivity type. The grid 27 may be a metal or a degenerate semiconductor of the same conductivity type as the emitter and collector regions 25 and 29. Where the emitter and collector regions 25 and 29 have P-type conductivity, the device operates with positive charge carriers, or holes. Where the emitter and collector regions 25 and 29 have N-type conductivity, the device operates with negative charge carriers, or electrons. The devices which operate with holes are the electrical analogues of the devices which operate with electrons. In all cases, the devices herein operate with majority charge carriers.

In the devices herein, the grid 27 has certain critical characteristics. The grid 27 preferably has a planar structure of uniform thickness. The grid 27 may be a continuous film, or it may have a mesh-like structure or, in the photo-controlled arrangement, it may be comprised of isolated dots supported by the emitter and collector regions 25 and 29.

The grid 27 makes blocking contact to the collector region 29. By blocking contact is meant that there is a potential barrier in the contact opposing the flow of majority charge carriers therethrough. Where the collector region 29 has N-type conductivity, the grid should be of a high work function material. Where the collector region 29 has a P-type conductivity, the grid should be of a low work function material. The grid 27 is preferably a metal or combination of metals. Some low work function metals are indium, gallium, tin, lead and cerium. Some high work function metals are gold, silver, nickel and copper. The grid 27 may also be a semiconductor material which has been doped to have the same conductivity type as the collector region 29 and in which the doping approaches degeneracy in the semiconductor. Where germanium is the grid material, the free charge carrier concentration is more than $10^{17}$ carriers/cc. and the conductivity is greater than 1 (ohm-cm.)$^{-1}$. Where the grid 27 is a semiconductor, preferably, it should have a large band gap to reduce excitation of carriers from the valence band thereof.

The grid 27 should also make blocking contact to the emitter region 25. The same comments apply to the grid-emitter blocking contact as so the grid-collector blocking contact. However, the potential barrier of the emitter blocking contact is preferably higher than the potential barrier of the collector blocking contact. This may be achieved by fabricating the grid from a uniform composition and selecting the emitter and collector regions 25 and 29 to be semiconductors with different charge carrier affinities; or, by selecting the emitter and collector regions 25 and 29 to be semiconductors having the same charge carrier affinity and the grid 27 at the respective contacts to have different charge carrier affinities, as by having different compositions in the grid 27, either layered or graded therein. Of course, both the emitter and collector regions 25 and 29 may have different charge carrier affinities and the grid 27 also may have different carrier affinities at the respective contacts.

Further, the grid 27 should be substantially transparent or permeable to free charge carriers across the thickness thereof between the emitter and collector regions. Free charge carriers which pass over the potential barrier of the emitter blocking contact have a relatively low energy averaging a few tenths to a few electron volts above the Fermi level of the grid 27. These carriers are emitted into the grid 27 and must pass through the grid 27 and be collected at the collector blocking contact without substantial loss in number. Such grid layers may be fabricated from either metals or semiconductors. In the case of metals, the grid 27 is less than 100 A. thick and preferably closer to a few atomic layers thick. Metal layers of this type may be prepared by evaporation or by plating. In the case of semiconductors, the grid 27 may be somewhat thicker up to about 1000 A. thick but is preferably thinner than 1000 A. so as to increase the permeability of the grid 27 to the passage of free charge carriers therethrough.

The collector region 29 may be any insulator or semiconductor doped to have a particular conductivity type. Some suitable semiconductors are cadmium sulfide, cadmium selenide, cadmium telluride, zinc sulfide, zinc selenide, zinc oxide, lead oxide, germanium and silicon. A feature of the collector region 29 is that it should have electrical characteristics somewhat similar to that of a vacuum as will appear more fully hereinafter. On applying a bias across the collector region 29, an electric field should be produced therein and across the entire collector region, such that the carrier current through the collector is proportional to the density of the carriers at the collector blocking contact interface with the grid 27.

FIGURES 1, 2 and 3 further illustrate some of the terminology used in this document. FIGURES 2 and 3 are energy diagrams wherein the ordinate is the energy or potential $e$ and the abscissa is the distance along the device of FIGURE 1. The contiguous region between the grid 27 and the collector region 29 is referred to as the collector blocking contact interface 30. The collector blocking contact 31 includes the collector blocking contact interface 30 and also a portion of the collector region 29 adjacent the collector blocking contact interface 30 where the energy bands are curved. The collector blocking contact 31 is shown, for example, by the bracketed region 31 on the energy diagrams of FIGURES 2 and 3. The height of the collector potential barrier is shown by the bracketed distance B of FIGURE 3.

The collector blocking contact 31 should be abrupt near the collector blocking contact interface 30; that is, the energy levels should change abruptly at the collector blocking contact interface 30. Then, the energy bands immediately within the collector region 29 slope away, down for electrons, up for holes, from the collector blocking contact interface 30. This abruptness and slope is effective to reduce the reflection of charge carriers moving into the collector region 29 back to the grid 27, and to provide rapid removal of collected charge carriers from the interface. Because of the requirment of abruptness, the grid 27 and the collector region 29 are of different materials fabricated by having an abrupt compositional transition.

The function of the collector blocking contact 31 and of the collector region 29 is to provide efficient collection of free charge carriers which have passed through the grid 27. This is achieved by a field distribution which provides a minimum of reflection at the collector blocking contact interface 30 and a rapid removal of free charge carriers, such that the current through the collector region 29 is in proportion to the density at the collector blocking contact interface 30. The thickness of the collector region 29 is not critical but, as a matter of convenience, is only a few microns thick.

The emitter region 25 may be selected and designed in a manner similar to that of the collector region 29. As used in this document the contiguous region between the emitter region 25 and the grid 27 is referred to as the emitter blocking contact interface 24. The emitter blocking contact 23 includes the emitter blocking contact interface 24 and a portion of the emitter region 25 adjacent the emitter blocking contact interface 24 where the energy bands bend. The height of the emitter potential barrier is shown by the bracketed distance A in FIGURE 3.

The emitter region 25 functions to provide a supply or reservoir of free charge carriers to be emitted into the grid 27. The emitter blocking contact 23 provides a means for modulating the density of free charge carriers emitted from the emitter region 25 into the grid 27 according to an input signal voltage applied to the grid 27. The emitted free charge carriers possess sufficient energy to pass through the grid 27 to be collected at the collector blocking contact 31. Accordingly, the emitter blocking contact 23 has a somewhat higher potential barrier A to charge carrier flow than the potential barrier B in the collector blocking contact 31. Further, the energy band transition between the grid 27 and the emitter blocking contact 23 need not be as abrupt as in the collector blocking contact 31, since there is little problem of reflection of charge carriers back to the grid. However, the emitter blocking contact 23 is abrupt by preference since it provides somewhat more efficient operation.

A further requirement upon the emitter region 25 is that it provide a large reservoir of free charge carriers so as to permit operation at high frequencies. A further requirement on the emitter blocking contact 23 is that, in response to a signal, it be capable of modulating the density of charge carriers flowing thereacross without imparting excessive noise to the signal. The thickness of the emitter region is not critical, but may vary from a few millimicrons to several mills.

An emitter ohmic contact 21 physically contacts the emitter region 25 at emitter ohmic interface 22. Any of the usual materials may be used to produce the emitter ohmic contact 21. If the emitter region 25 is of N-type conductivity, the emitter ohmic contact 21 may be a low work function material, such as indium, gallium, or tin, or combinations thereof. If the emitter region 25 is of P-type conductivity, the emitter ohmic contact 21 may be a high work function material, such as copper, gold, silver, nickel, and tellurium or combinations thereof. The collector ohmic contact 33 contacts the collector region 29 at a collector ohmic interface 34. The collector ohmic contact 33 may be a material selected in the same manner as the emitter ohmic contact 21.

The typical device may be operated as an amplifier in the circuit illustrated in FIGURE 1. The emitter ohmic contact 21 is connected to ground 35 by an emitter lead 49. The grid 27 is connected to ground 35 through a grid bias means 41, which may be a battery, and a grid resistance 39 connected in series therewith by a grid lead 51. The collector ohmic contact 33 is connected to ground 35 through a load resistance 45 and a collector bias means 47, which may be a battery, connected in series therewith by a collector lead 53. Input terminals 37 are connected across grid resistance 39. Output terminals 43 are connected across the load resistance 45.

If the emitter and collector regions 25 and 29 are N-type, the grid 27 and the collector ohmic contact 33 are biased to positive polarity; whereas if the emitter and collector regions 25 and 29 are P-type, the grid 27 and the collector ohmic contact 33 are biased to negative polarity. The magnitudes of the bias applied to the grid 27 and collector ohmic contact 33 are generally the same in the two cases.

Assuming the emitter and collector regions 25 and 29 are N-type, a positive bias of about zero to 1 volt is applied to the grid 27 and a positive bias of about 10 to 100 volts is applied to the collector ohmic contact 33. When a signal in the form of a variable voltage which swings the grid voltage between zero and 1 volt is applied to the input terminal 37, an amplified replica of the signal in the form of a variable voltage appears at the output terminals 43.

The internal operation of a device having N-type emitter and collector regions is now explained in connection with FIGURES 2 and 3, which are diagrams plotting energy on the ordinate against distance along the device illustrated in FIGURE 1 on the abscissa. The respective parts are similarly labeled. FIGURE 3 illustrates the device with no bias applied. The significant energy levels of the diagrams are the top of the valence band shown as the lower horizontal line 71 in each of the emitter and collector regions 25 and 29, the bottom of the conduction band is the upper horizontal lines 73 in each of the emitter and collector regions 25 and 29, and the Fermi level shown as the dotted lines 75. A "barrier" refers to the condition where the levels 71 and 73 curve upwardly at the emitter and collector blocking contacts 23 and 31, making the transfer of carriers thereacross less probable than elsewhere in the region.

When an operating bias is applied to the device, the position of the energy bands are changed as shown in FIGURE 2. The grid bias has the effect of reducing the height of the potential barrier shown by the vertical distance E to current flow from emitter region 25 to the grid 27. The input signal has the effect of varying this height E around its bias. Varying the height of the potential barrier E of the emitter blocking contact, varies the density of carriers passing across the emitter blocking contact 23. The lower the signal voltage, the greater the height of the potential barrier E and the lower the carrier density. The greater the signal voltage, the lower the height of the potential barrier E and the greater the carrier density. The path of a typical electron across the emitter ohmic contact interface 22 is shown by the arrow 81. And, similarly, the path of a typical electron over the emitter blocking contact 23 is shown by the arrow 83.

It should be noted that an electron coming across the emitter blocking contact 23 has increased energy with respect to the electrons in the system. The grid 27 is fabricated to be transparent or permeable to electrons with such increased energy. Hence, the carriers which have passed across the emitter blocking contact 23 will pass through the grid 27 to the collector blocking contact 31 as shown by the arrow 85 without appreciable loss in density. Thus, the density of carriers at the collector blocking interface 30 is substantially proportional to the input signal.

The energy levels 71 and 73 in the collector blocking contact 31 are designed to slope downward sharply away from the collector interface 30. The collector bias has the effect of further steepening this slope and of extending the length of the slope along the region 29. The abrupt slope of the energy bands of the collector blocking contact 31 has the effect of reducing the reflection of energetic electrons from the collector blocking contact 31 back into the grid 27. The slope of the energy levels has the effect of imparting into the collector region 29 the characteristic that the carrier current therethrough is proportional to the carrier density at the collector blocking contact 30. The path of the electron through the collector 29 is shown by the arrow 87. The arrow 89 shows the path of the electron across the collector ohmic contact interface 24 in the conventional manner.

The device draws only a small amount of signal power compared with the available output power. The input has a very low impedance since the emitter is operated in the forward direction of current flow. The output has a very high impedance since the collector is operated in the back direction of current flow, and such that the current to the collector is insensitive to the potential on the collector. The power gain of the device is proportional to the ratio of output impedance to input impedance. A further gain is achieved insofar as the emitter to collector current is large compared with the grid current.

FIGURES 3, 4, and 5 are energy diagrams of various device structures of the invention with N-type emitter and collector regions 25 and 29. In FIGURE 3, the grid 27 has a uniform composition and the emitter and collector regions 25 and 29 are of different compositions having different electron affinities. By such selection, the energy step A at the emitter-grid interface 24 is larger than the energy step B at the collector-grid interface 30. Thus, for example, the emitter region 25 may be of a highly doped N-type cadmium sulfide, the collector region 29 may be of less highly doped N-type lead oxide, and the grid 27 may be of a high work function metal such as gold.

In FIGURES 4 and 5, the emitter and collector regions 25 and 29 have the same compositions. In FIGURE 4, the grid is comprised of two layers 27′ and 27″ of different compositions, the former contiguous with the emitter region 25, and the latter contiguous with collector region 29, each layer having a different electron affinity. Here again, the energy step A of the emitter-grid interface 24 is larger than the energy step B at the collector-grid interface 30. Thus, in FIGURE 4, both the emitter and collector regions 25 and 29 may be of the same highly doped N-type cadmium sulfide; the grid layer 27′ adjacent the emitter-grid interface 24 may be of copper; and the grid layer 27″ adjacent the collector-grid interface 30 may be of gold. In FIGURE 5, the grid is of one layer but has a different composition adjacent the opposite interfaces 24 and 30, and the composition in the grid 27 grades gradually from one to the other between the interfaces.

FIGURES 6, 7, and 8 are energy diagrams of various device structures of the invention made with P-type emitter and collector regions 25 and 29. These devices are electrical analogues of the devices of FIGURES 3 to 5 respectively. One important difference in the devices; FIGURES 6, 7, and 8 over the devices of FIGURES 3, 4 and 5 is that the devices of FIGURES 6, 7 and 8 all operate with holes, instead of electrons, as the carriers, and therefore the energy bands curve up, instead of down, in departing from the emitter and collector blocking contacts 23 and 31. Since these devices operate on holes, the energy steps C and D correspond to the energy steps A and B respectively of FIGURES 3 to 5. The devices of FIGURES 6, 7, and 8 otherwise correspond to the device of FIGURES 3, 4, and 5 respectively.

In all of the foregoing structures, one problem is to get most of the electrons (or holes) "through" the grid 27 instead of being absorbed by the grid 27. If we think of the grid 27 as a monolayer of metal and if we take the mean free path of an electron (or hole) for energy loss in a metal to be 10 lattice spacings, then about 90% of the current should pass through the grid 27 and into the collector region 29.

The frequency response of this device can be limited by the average transit time of an electron (or hole) from emitter electrode 21 to grid 27 or grid 27 to collector electrode 33. Since the grid-collector voltage is high and the spacing small this transit time is likely to be much less than $10^{-10}$ secs. The transit time from emitter to grid will be given by the relative time in the barrier when it is made positive. For a material of about 1 ohm cm. in the barrier region, this transit time would be about $10^{-12}$ secs. for an electron. Alternatively, one can think of the transit time of electrons through a barrier of say $10^{-1}$ microns. This would be approximately $$\frac{10^{-5} \text{ cm.}}{10^{-7} \text{ cm./sec.}} = 10^{-12} \text{ seconds}$$

*Example 1.*—FIGURE 9 illustrates an embodiment of the invention. The device comprises a single crystal **25*b* of cadmium sulfide doped with chlorine to a resistivity of about one ohm-cm. Upon the upper surface of the crystal 25*b* is a thin electron permeable layer 27*b* of copper metal, which has thereover a thin layer 29*b* of lead oxide doped with excess lead to a resistivity of about one ohm-cm. Identical thin layers 21*b* and 33*b* of indium metal are in ohmic contact with the opposite surface of the crystal 25*b* and with the lead oxide layer 29*b*** respectively.

The thin copper metal layer **27*b* is prepared by evaporating the metal on a smooth crystal face of the crystal 25*b*, which is maintained at a low temperature (e.g. liquid air temperature) to avoid aggregation of the metal atoms and to obtain good conductivity with only a few atomic layers of metal. The lead oxide layer 29*b* is evaporated on the copper metal layer 27*b* while it is still at the low temperature in order to fix mechanically the copper metal layer 27*b* so that it does not aggregate when it is warmed up to room temperature. The two indium metal layers 21*b* and 33*b*** are also preferably evaporated with the crystal at the low temperatures, as a matter of convenience, although they may be evaporated with the crystal at room temperature.

Emitter, grid and collector leads **49*b*, 51*b* and 53*b* are connected to the indium, copper, and indium metal layers 21*b*, 27*b* and 33*b* respectively, as with metal paste or by pressing a low melting metal into contact. Such device may be operated by applying ground potential to the emitter lead 49*b*, about 50 volts positive to the collector lead 53*b* and between about zero and one volt positive to the grid lead 51*b***.

*Example 2.*—FIGURE 10 illustrates an embodiment of the invention similar to that of the embodiment of FIGURE 9, except that all of the active structures of the device are thin layers on a support. In particular, the embodiment of FIGURE 10 comprises a plurality of layers on one side of a support 61 which may be glass or a ceramic or a metal, in the followig order: first layer **21*c* of indium metal on one side of the support 61, a second layer 25*c* of highly doped N-type cadmium sulfide: chlorine semi-conductor upon the first layer 21*c*, a third layer 27*c* of copper metal on the second layer 25*c*, a fourth layer 29*c* of highly doped N-type lead oxide: lead semiconductor on the third layer 27*c*, and a fifth layer 33*c* of indium metal on the fourth layer 29*c*. The layers overlie one another in the central area of the device and extend radially in different directions to provide areas for connection. Emitter, grid, and collector leads 49*c*, 51*c* and 53*c* are connected to the first, third, and fifth layer 21*c*, 27*c* and 33*c* respectively as in Example 1. If the support 61 is conducting and makes ohmic contact to the second layer 25*c*, the first layer 21*c*** may be omitted. The embodiment is operated in the manner of the embodiment of Example 1.

*Example 3.*—FIGURE 11 illustrates another embodiment of the invention comprising a single crystal **29*d*, having two opposed surfaces, of cadmium sulfide doped with chlorine, a thin electron permeable layer 27*d* of copper metal on one opposed surface, a layer 25*d* of lead doped lead monoxide on the copper metal layer 27*d*, a first droplet 21*d* of indium metal on the lead monoxide layer 25*d*, a second droplet 33*d* of indium metal on the other opposed surface of the crystal 29*d*. Emitter, grid and collector leads 49*d*, 51*d*, and 53*d* are connected to the first indium droplet 21*d*, the copper layer 27*d* and the second indium droplet 33*d*** as in Example 1.

The embodiment of FIGURE 11 may be prepared as follows. Select a plate-like crystal **29*d* of cadmium sulfide doped with chlorine to make it N-type and to have a resistivity of about one ohm-cm. The crystal is about 1.0 cm. by 1.0 cm. by 0.01 cm. thick, thereby providing two major opposed surfaces. Melt a droplet 33*d* of indium on one opposed surface of the crystal 29*d*. Evaporate a 20 A. thick continuous film 27*d* of copper metal upon the other opposed surface of the crystal 29*d* at liquid air temperature. Evaporate a 5 micron thick layer 25*d* of lead monoxide on the copper layer 27*d* at room temperature. Melt a droplet 21*d* on the lead monoxide layer 25*d*. Emitter, grid and colletcor leads 49*d*, 51*d* and 53*d*** are then soldered in place with a low temperature solder.

*Example 4.*—The embodiment of FIGURE 12 is identical with the embodiment of FIGURE 11 (Example 3), except that the copper metal layer **27*d* is a fine mesh 27*e* instead of a continuous film. The mesh size is small compared with the thickness of the emitter blocking contact 23. Some typical dimensions are: emitter blocking contact thickness 1.0 micron, mesh opening size 0.1 micron, mesh wire size 0.01 micron. Such a mesh may, for example, form naturally during the early stages of evaporation of a metal film when some of the metal has aggregated and the aggregations are just beginning to be bridged. In the interstices of the mesh 27*e*, the two semiconductor layers 25*e* and 29*e* are in the actual physical contact with one another. This physical contact is blocking owing to surface states on the CdS crystal surface and is biased by the copper mesh 27*b*** during the operation of the device owing to interelement capacitance.

*Example 5.*—FIGURE 13 illustrates an embodiment of the invention wherein the input signal is in the form of radiant energy $h\nu$ which may be infrared, visible, ultraviolet, etc. depending upon the bandgaps of the semiconductors selected for the emiter and collector regions and the electron affinities of the materials selected for the grid.

The device of FIGURE 13 is a composite multilayer structure comprising an emitter ohmic contact **21*f* of iron metal, contacting an emitter region 25*f* of P-type gray selenium, contacting a grid 27*f* of indium metal, contacting a collector region 29*f* of P-type lead oxide contacting a collector ohmic contact 33*f* of iron metal. Since a light signal $h\nu$ is to enter through the emitter region 25*f*, the emitter region 25*f* and the emitter ohmic contact 21*f* are as thin as possible in order to reduce the absorption of light in these regions. The grid 27*f* may be a continuous film, or a mesh or may be an array of isolated areas, dots or droplets, for example. As illustrated in FIGURE 13, the grid 27*f*** is an array of isolated droplets. The device is otherwise similar in structure to the device of Example 1.

In operation, the emiter ohmic contact **21*f* is connected to ground 35*f* by an emitter lead 49*f*. The grid 27*f* is floating electrically. It is for this reason, that the grid 27*f* in this embodiment may be comprised of isolated areas. The collector ohmic contact 33*f* is connected by collector lead 53*f* through a load resistor 45*f* and a biasing source, which may be a battery 47*f*, to ground 35*f*. Output terminals 43*f* are connected across load resistor 45*f***.

A negative bias voltage of about 10 volts is applied to the collector ohmic contact 33*f*. Light $h\nu$ is directed through the emitter region 25*f* incident upon the grid 27*f*. The incident light energy $h\nu$ is absorbed by the grid 27*f* causing positive charge carriers, or holes, to be emitted by the grid 27*f* into the collector region 29*f*. This leaves the grid 27*f* negatively charged. The negative charge on the grid 27*f* causes holes to flow from the emitter region 25*f* over the barrier of the emitter blocking contact into the grid 27*f*. Since the grid 27*f* is transparent or permeable to energetic holes, the injected holes pass directly to the collector contact where they are collected producing a useful gain; that is, more than one carrier is collected per incident photon.

This embodiment is sensitive to light in the near infrared, because the gray selenium transmits these wavelengths and absorbs visible and ultra violet wavelengths. The light absorbed by the selenium may produce an increase in conductivity therein. However, this change in conductivity does not adversely affect the operation of this device, since it does not effect the height of the barrier of the emitter blocking contact.

*Example 6*.—Another embodiment is identical in structure and operation to the embodiment of FIGURE 13 (Example 5), except that the radiation $h\nu$ is to be introduced through the collector region 29*f*. To this end, the collector region 29*f* and the collector ohmic contact 33*f* are made as thin as possible to reduce the absoprtion of the incident radiant energy. Since lead oxide has a larger band gap than gray selenium, the device of this embodiment is sensitive to near infrared radiation and to red and yellow radiation in the visible spectrum.

There have been described improved solid state devices which may be used for amplifying, switching, and similar function in electronic circuits.

What is claimed is:

1. A solid-state device comprising a first body of a semiconductor material having a particular conductivity type, an ohmic contact to said first body, a conducting body selected from the group consisting of metals and degenerate semiconductors having said particular conductivity type making abrupt blocking contact to said first body, a second body of a semiconductor material containing impurities sufficient to produce therein a high conductivity of said particular conductivity type contacting said conducting body, and means including said second body for injecting free charge carriers into said conducting body, said conducting body being substantially transparent to injected free charge carriers between the point of said injection and said blocking contact.

2. The device of claim 1 wherein said conducting layer is metal less than 100 A. thick.

3. The device of claim 1 wherein said conducting layer is degenerate semiconductor less than 1000 A. thick.

4. The device of claim 1 wherein said injecting means comprises said second semiconductor body in abrupt blocking contact with said conducting body, an ohmic contact to said conducting body, and an ohmic contact to said second semiconductor body.

5. A solid-state device comprising a first body of semiconductor material having a particular conductivity type, a second body of semiconductor material containing impurities sufficient to produce therein a high conductivity of said particular conductivity type, said first and second semiconductor bodies contacting and being spaced by a third body selected from the class consisting of metals and degenerate semiconductors having said particular conductivity type, said third body making abrupt rectifying contact to each of said first and second semiconductor bodies, said third body having a thickness between said first and second bodies transparent to free charge carriers injected from said second semiconductor body, the rectifying contact between said first and third body providing a lower energy barrier to the flow of majority charge carriers than the rectifying contact between said second and third body, a first ohmic contact to said first semiconductor body, and a second ohmic contact to said second semiconductor body.

6. The device of claim 5 wherein said third body is a continuous film.

7. The device of claim 5 wherein said third body is a mesh.

8. The device of claim 5 wherein said third body is an array of isolated conducting areas.

9. The device of claim 5 wherein said third body is metal having a thickness less than 100 A.

10. The device of claim 9 wherein said first and second bodies have N-type conductivity.

11. The device of claim 5 wherein said third body is a degenerate semiconductor body less than 1000 A. thick.

12. A solid-state device comprising a plurality of layers in the following order: a first layer of metal, a second layer of high band gap semiconducting material containing impurities sufficient to produce a high conductivity of a particular conductivity type therein in ohmic contact with said first layer, a third layer selected from the class consisting of metals and degenerate semiconductors having said particular conductivity type in abrupt blocking contact with said second layer, said third layer having a thickness such that said third layer is substantially transparent across its thickness to majority charge carriers incident on said third layer, a fourth layer of semiconductor material having said particular conductivity type in abrupt blocking contact with said third layer, and a fifth layer of metal in ohmic contact with said fourth layer, the blocking contact between said second and third layer providing a lower energy barrier to the flow of majority charge carriers than said blocking contact between said third and said fourth layer.

13. The device of claim 12, wherein said third layer is metal of uniform composition less than 100 A. thick, and said second and fourth layers are semiconductors having different compositions.

14. The device of claim 13, wherein said second and fourth layers have N-type conductivity.

15. The device of claim 12, wherein said third layer has a different composition adjacent each of said blocking contacts respectively and said second and fourth layers are semiconductors having the same composition.

16. The device of claim 15 wherein said third layer comprises two separate portions, each of a different composition, one portion being adjacent one of said blocking contacts and the other portion being adjacent the other of said blocking contacts.

17. The device of claim 12, wherein said third layer is a degenerate semiconductor less than 1000 A. thick and said second, third and fourth layers are semiconductors having different compositions.

18. In combination, a device including first and third layers spaced apart by a second layer, said first and third layers comprising semiconductor material of like conductivity type, said second layer comprising metallic material for forming first and second rectifying barriers with said first and third layers respectively, separate low resistance ohmic contacts to each of said layers, means for forward biasing said first rectifying barrier for injecting charge carriers into said second layer, means for reverse biasing said second barrier for collecting the charge carriers, and a signal means for controlling the flow of said charge carriers, said second layer being sufficiently thin to enable the collection of the injected charge carriers.

19. A signal translating device comprising a continuous metallic layer having a thickness of less than about the length of a mean free path of a charge carrier in said layer intermediate between a first and second layer of semiconductor material of like conductivity type, and a separate low resistance ohmic contact to each of the three layers.

20. A signal translating device in accordance with claim 19 wherein said intermediate layer has a thickness less than the length of a mean free path of a charge carrier in said layer.

21. A signal translating device in accordance with claim 19 wherein said intermediate layer comprises a layer of gold about 100 Angstrom units thick.

22. A signal translating device in accordance with claim 19 wherein said intermediate layer comprises two distinct layers of first and second metals.

23. A signal translating device in accordance with claim 19 wherein said first and second layers of semiconductor material are of the same semiconductor material.

24. A signal translating device in accordance with claim 19 wherein said first layer of semiconductor material is a first semiconductor material and said second layer of semiconductor material is a different second semiconductor material.

25. A signal translating device in accordance with claim 19 wherein said first layer of semiconductor material is silicon, said metallic layer is gold and said second layer of semiconductor material is silicon.

26. A signal translating device in accordance with claim 19 wherein said first layer of semiconductor material is silicon, said metallic layer is gold and said second layer of semiconductor material is germanium.

27. A signal translating device in accordance with claim 19 wherein said first layer of semiconductor material comprises cadmium sulphide, said metallic layer comprises gold and said second layer of semiconductor material comprises a material selected from the class consisting of cadmium sulphide, gallium phosphide, gallium arsenide, silicon and germanium.

28. A signal translating device comprising a semiconductor layer in intimate contact with a metallic layer and forming therebetween a metal-semiconductor barrier, said semiconductor containing impurities sufficient to produce therein a high conductivity of a particular conductivity type, said metallic layer being of a thickness of less than about a mean free path of a charge carrier therein to permit the passage therethrough of the carriers which are in the majority in the region of the semiconductor contiguous thereto an ohmic contact to said semiconductor layer, and means adjacent said metallic layer for collecting the majority carriers which successfully traverse the metallic layer, the metallic layer being free of any openings permitting the direct passage of carriers between the semiconductor layer and the collecting means.

References Cited by the Examiner

UNITED STATES PATENTS

| | | | |
|---|---|---|---|
| 2,208,455 | 7/1940 | Glaser et al. | 317—237 |
| 2,524,270 | 10/1950 | Pelfrey | 317—241 |
| 2,603,694 | 7/1952 | Kircher | 317—235 |
| 2,836,776 | 5/1958 | Ishikawa et al. | 317—242 |
| 3,056,073 | 9/1962 | Mead | 317—234 |
| 3,121,809 | 2/1962 | Atalla | 307—88.5 |

ARTHUR GAUSS, *Primary Examiner.*

LLOYD McCOLLUM, GEORGE N. WESTBY, DAVID J. GALVIN, *Examiners.*

A. B. GOODALL, L. ZALMAN, J. BUSCH, *Assistant Examiners.*